United States Patent [19]

Lemkey et al.

[11] 4,441,939
[45] Apr. 10, 1984

[54] $M_7C_3$ REINFORCED IRON BASE SUPERALLOYS

[75] Inventors: Franklin D. Lemkey, Windsor; Earl R. Thompson, Glastonbury, both of Conn.

[73] Assignee: United Technologies Corporation, Hartford, Conn.

[21] Appl. No.: 318,774

[22] Filed: Nov. 6, 1981

[51] Int. Cl.$^3$ .................. C22C 38/36; C22C 38/38
[52] U.S. Cl. ................... 148/31; 75/126 A; 75/126 B; 148/38
[58] Field of Search .............. 148/38, 35, 3, 31; 75/126 A, 126 B, 124; 428/549, 562, 567

[56] References Cited

U.S. PATENT DOCUMENTS 3,847,679 11/1974 Livingston .................. 148/3
4,305,761 12/1981 Bruch et al. .................. 148/3

FOREIGN PATENT DOCUMENTS 7004767 10/1971 Netherlands .................. 75/126 A

*Primary Examiner*—Peter K. Skiff
*Attorney, Agent, or Firm*—Charles E. Sohl

[57] ABSTRACT

A carbide reinforced iron based superalloy material is described. The material consists of an austenitic matrix containing about 30 volume percent aligned $M_7C_3$ phase fibers. Fiber alignment is produced by directional solidification. A nominal alloy composition (by weight) is 20% Cr, 10% Mn, 5% Al, 3.2% C. balance iron. The alloys are characterized by the absence of strategic elements, are east to process and have superior mechanical properties to the known prior art, low nickel, iron base superalloys.

10 Claims, 2 Drawing Figures

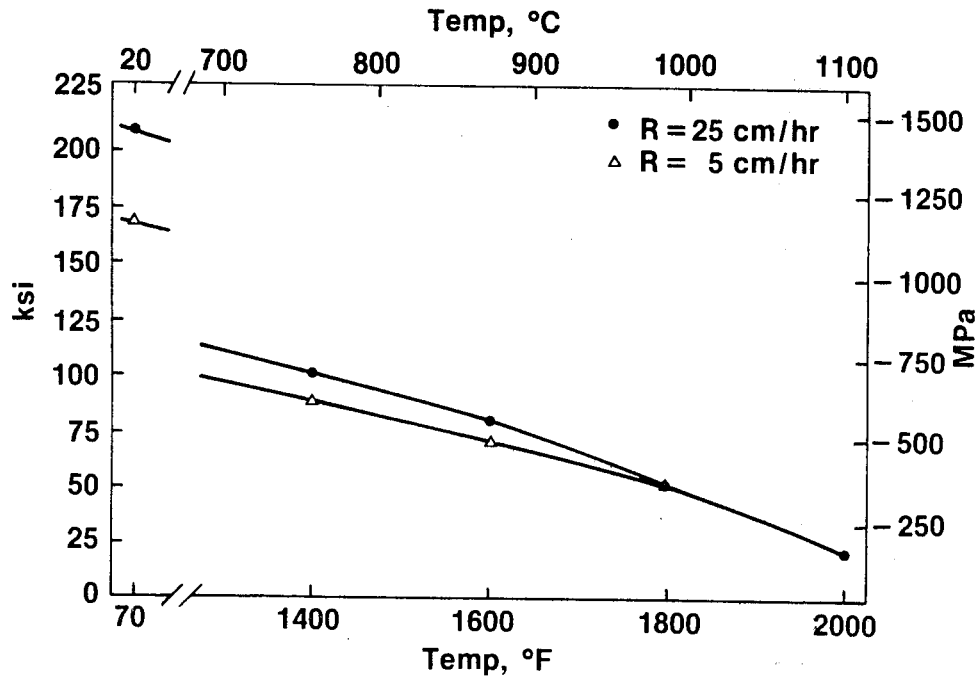
*FIG. 1* ULTIMATE STRENGTH
Fe-20 Cr-10 Mn-3.4 C, longitudinal
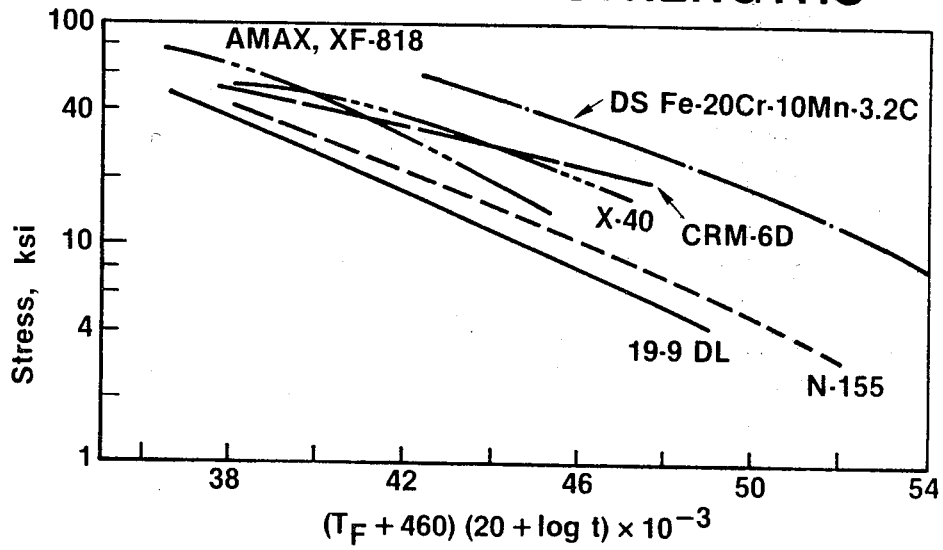
*FIG. 2* STRESS RUPTURE STRENGTHS

M₇C₃ REINFORCED IRON BASE SUPERALLOYS

DESCRIPTION

TECHNICAL FIELD

This invention relates to the field of iron base superalloys, particularly to iron base superalloys which contain relatively low (less than 20%) amounts of nickel. This invention also relates to the field of directionally solidified eutectics wherein an alloy of eutectic composition may be directionally solidified to produce an aligned microstructure having anisotropic mechanical properties.

BACKGROUND ART

It is now known that certain eutectic alloys respond to proper directional solidification conditions to produce useful microstructures in which the second phase is aligned. This is generally described in the patent to Kraft, U.S. Pat. No. 3,124,452. The patent to Thompson and Lemkey, U.S. Pat. No. 3,564,940, describes a class of compositions which solidify according to the monovariant eutectic reaction to provide aligned poly phase structures. In U.S. Pat. No. 3,671,223, the concept has been further developed to include those systems which solidify according to the multivariant eutectic reaction.

U.S. Pat. No. 3,671,223 describes certain eutectic compositions which can be directionally solidified to produce $M_7C_3$ type fibers in an iron, cobalt, or nickel matrix. U.S. Pats. Nos. 3,554,817, 3,793,010 and 4,111,723 describes more specific nickel base eutectic compositions for use at elevated temperatures.

DISCLOSURE OF INVENTION

It is an object of this invention to provide a low cost iron base material suitable for use at elevated temperatures.

It is another object of this invention to provide a high strength iron base material which also has a low density.

Another object of this invention is to provide directionally solidified iron base articles which have an austenitic matrix and which are strengthened by aligned carbide fibers.

Yet another object of the invention is to provide a method for producing iron based articles containing aligned $M_7C_3$ fibers.

These and other objects of the invention are accomplished by providing material within a particular composition range and processing the material in a particular fashion. The broad composition range is: 15–30% Cr, 8–20% Mn, 2–8% Al, 2.5–3.4% C balance essentially iron.

Material within this composition range may be directionally solidified under conditions where G/R exceeds about 3° C. cm⁻² hr, where G is the gradient and R is the rate of solidification, to provide the desired material.

Other features and advantages will be apparent from the specification and claims and from the accompanying drawings which illustrate an embodiment of the invention.

BRIEF DESCRIPTION OF DRAWINGS

FIG. 1 depicts the strength as a function of temperature of an alloy similar to that of the present invention.

FIG. 2 illustrates the stress rupture properties of a representative alloy as contrasted with prior art alloys.

BEST MODE FOR CARRYING OUT THE INVENTION

Throughout this invention, all percent figures are in weight percent unless otherwise specified.

The present invention consists of a iron base superalloy composition which is reinforced by aligned carbide fibers of the $M_7C_3$ type and which is suitable for use at temperatures in excess of 1500° F. The composition contains two major phases, a continuous austenitic matrix phase and about 30% by volume of the $M_7C_3$ carbide phase. Austenite is an iron solid solution material having a face centered cubic (F.C.C.) structure. As used herein, the term fiber refers to elongated regions or crystallites of the $M_7C_3$ phase. The fibers have an irregular varying cross section and have a length to (average) diameter ratio which is (on average) greater than 10. The composition is a multivariant eutectic and the phases form directly upon solidification. Consequently, the phases are stable with respect to each other even after exposures at elevated temperatures for long periods of time.

The invention compositions can be directionally solidified to produce useful articles, especially gas turbine components. Not only blades and vanes, but other cast components may be fabricated. Of course, the invention is not limited to gas turbine components and other articles such as furnace components and the like may also be fabricated from the invention material.

The broad composition range of the alloys is 15–30% Cr, 8–20% Mn, 3–10% Al, 2.8–3.4% C, balance essentially iron. In most alloys, the iron will be present in an amount of at least 50%, and usually at least 60%, by weight. The manganese plays a significant role in stabilizing the desired austenitic (face centered cubic) matrix structure. The chromium and aluminum on the other hand tend to promote the less desirable ferrite (body centered cubic) structure. The aluminum, in particular, is an extremely effective ferrite stabilizer and consequently is preferrably present in an amount less than about ½ the manganese level. The chromium has a lesser effect on the matrix microstructure since about ½ the chromium is found in the carbide phase. The chromium and aluminum are desirable since they contribute significantly to the oxidation and corrosion resistance of the alloy.

The following example will illustrate the typical distribution of elements in the alloy phases after directional solidification. An alloy containing 20% Cr, 10% Mn, 5% Al, 3.2% C, balance (61.8%) iron was directionally solidified to produce an austenitic matrix containing about 30% by volume of aligned $M_7C_3$ fibers. The fibers were extracted and analyzed and found to contain 45.2% Cr, 10.2% Mn, 0.3% Al, 10.7% C, balance (33.6%) iron. Using chemical notation the fibers were:

$$Cr_{3.6}Mn_{.8}Fe_{2.5}Al_{.1}C_3 = M_7C_3$$

The maxtrix composition was 10.6% Cr, 9.3% Mn, 4.6% Al, 0% C, balance (75.5%) iron. Thus, it can be seen that the chromium and carbon partition strongly to the fiber phase while the aluminum partitions strongly to the matrix phase. Additions of Co and Ni may be made and these elements, if present, will partition to both phases. The "M" portion of the $M_7C_3$ phase will be at least 80% of metals chosen from the group consisting of Cr, Mn, Fe, Ni and Co.

Minor element additions may be made to this composition without avoiding the inventive concept. In particular, up to 1% of material selected from the group consisting of Y, Sc, La and mixtures thereof may be added for improved oxidation behavior. Additions of Mo and W may be made for strengthening, however, more than about 1% Mo and/or W will encourage the formation of undesirable carbide phases at the expense of the desired $M_7C_3$ type phases. For the same reason, the other refractory elements such as Ta, Cb and along with Hf and Ti cannot be added in any significant amount, e.g., their total content should be less than about 0.5%.

A preferred composition range for the essential ingredients is 15-25% Cr, 10-20% Mn, 4-8% Al, 2.8-3.2% C, balance essentially iron. In an even more preferred composition, the sum of the maganese and chromium are constrained to be within 25-35% by weight. The sum of Al and Cr preferrably exceeds 18 and most preferrably exceeds 20% in order to provide resistance to oxidation and corrosion.

Additions of oxygen active elements such as Y, La and Sc will improve oxidation behavior and these elements may be added in amounts of up to 1% and preferrably 0.2-0.8%.

While the invention alloy is an iron base alloy, those skilled in the art will appreciate the elements cobalt and nickel can be substituted for iron in substantial amounts without adversely affecting the phases present. With one exception, we do not believe there is any significant benefit to be obtained through the substantial use of nickel and cobalt in place of iron, and in fact, there is a substantial economic detriment associated with the use of nickel and cobalt. Consequently, the sum of nickel and cobalt is limited to be 20% by weight and when present, the nickel and cobalt are substituted for an equiatomic amount of iron. In prior development of electrical resistance alloys known as Kanthal alloys (produced by the Kanthal Corporation), it was found that small amounts of cobalt, on the order of 0.5%, increased the oxidation resistance of the alloys apparently through the formation of a complex more adherent protective oxide or spinel. A typical Kanthal composition is 4% Al, 15% Cr balance iron. In view of the similarities of this alloy to the matrix composition of the invention, it is believed that small amounts (e.g., 0.2-2%) of cobalt may be used to improve the oxidation resistance of the invention.

It is known in the art that the achievement of aligned eutectic structures by directional solidification requires that certain conditions be satisfied. In particular for each composition, a certain ratio of thermal gradient to solidification rate be exceeded. The gradient is the temperature gradient measured across the solidification interface into the melt, while the rate is the rate of traverse of solidification interface. In this respect, the alloy of the present invention is substantially less demanding than most previously known eutectics such as those described in U.S. Pats. Nos. 3,554,817, 3,793,010 and 4,111,723 which required G/R values on the order of 100°C. cm$^{-2}$ hr. The present invention requires only G/R values in excess of about 3° C. cm$^{-2}$ hr. By way of contrast, the directional solidification of noneutectic superalloys is performed at G/R values of 1°-2° C. cm$^{-2}$ hr. Thus, the alloys of the present invention are potentially processible using the same apparatus and techniques as those used for conventional directional solidified compositions.

It is known that increasing R, the rate of solidification produces a finer structure, i.e., the carbide fiberts will be of smaller diameter and will be more closely spaced. In turn, this affects the mechanical properties and this is illustrated in FIG. 1 which shows the ultimate tensile strength of an alloy containing 20% Cr, 10% Mn, 3.4% C, balance iron. Note that this composition lies outside the invention because it does not contain aluminum, however, the presence of aluminum plays only a slight role in mechanical properties although it strongly affects the oxidation and corrosion behavior of the composition. We believe the data in the figure would not be significantly changed if 5% aluminum were added. The figure shows that a higher solidification rate produces a resultant finer structure which has better mechanical properties at the lower temperature but that these differences become less with increasing temperature and there is no apparent difference at elevated temperatures.

FIG. 2 compares stress rupture properties for the invention alloys with those of other prior art high temperature alloys. It is apparent that the invention alloy is significantly stronger than the prior art alloys. The compositions of the alloys whose properties are shown in FIG. 2 are presented in Table 1. The alloys are iron base except for X40 (cobalt base) and IN 713C (nickel base). Note that, in general, the high performance alloys contain substantial amounts of expensive alloying elements such as nickel which are not required in the present invention. The table also contains a value for the elemental constituents of each alloy and a value of stress required to produce rupture in 1,000 hours at 1500° F. The behavior of the present invention composition is outstanding.

Table 2 illustrates the cyclic oxidation behavior of several alloy compositions which are variations on the matrix composition of the present invention. The carbon level is insufficient to form the $M_7C_3$ phase as aligned fibers, instead carbides are present at the grain boundaries but this does not significantly affect oxidation. The table also lists the weight loss at the end of 200 hours of testing. It can be seen that in the absence of aluminum, 20% chromium is required to provide good oxidation resistance. Compare for example, alloys 1 and 10. It can also be seen that alloy 2 containing 15% chromium and 5% aluminum had oxidation behavior superior to that of alloy 1. Thus, it is preferred that chromium plus aluminum exceed 18% and preferably 20% by weight.

In oxidation testing the presence of 20% chromium was shown to provide good oxidation performance even in the absence of aluminum. In hot corrosion testing, however, aluminum is necessary to provide resistance to corrosion. Table 3 shows the composition of six alloys which were tested for 96 hours in a cyclic corrosion test at 1650° F. using $Na_2SO_4$ to induce corrosion. Here the presence of even 20% chromium does not completely control hot corrosion in the absence of aluminum, however the combination of 15% chromium and 5% aluminum effectively eliminates hot corrosion. Again, the guideline that aluminum and chromium should equal 18% and preferably 20% is shown to be effective in predicting alloy performance. However, in the hot corrosion case, it can be seen that aluminum (e.g., 3%) is required to resist hot corrosion. The hot corrosion behavior of the invention alloy is generally better than that of other moderate strength nickel base superalloys. While directly comparable data is lacking, indications are that the IN 713C alloy, described in Table 1 has notably inferior hot corrosion resistance.

A further advantage of the present material is its low density. Density is important, particularly in rotating parts. Typical nickel base superalloys have densities of 8–9.0% g/cc. The density of the invention material is about 7.2 g/cc, a significant density reduction when compared with the prior art.

It should be understood that the invention is not limited to the particular embodiments shown and described herein, but that various changes and modifications may be made without departing from the spirit and scope of this novel concept as defined by the following claims.

TABLE 1

|  | Present Invention | CRM6D | 19-9 DL | XF 818 | N 155 | X40 | IN 713C |
|---|---|---|---|---|---|---|---|
| Fe | Balance | Balance | Balance | Balance | Balance | 1.5 | — |
| Ni | — | 5 | 9 | 18 | 20 | 10 | Balance |
| Co | — | — | — | — | 20 | Balance | — |
| Mn | 10 | 5.0 | 1.1 | .1 | 1.5 | .5 | — |
| Cr | 20 | 22 | 19 | — | 21 | 25 | 12 |
| Mo | — | 1.0 | 1.25 | 7.5 | 3.0 | — | 4.5 |
| W | — | 1.0 | 1.2 | — | 2.5 | 7.5 | — |
| Cb | — | 1.0 | .4 | .4 | 1.0 | — | 2.0 |
| Ta | — | — | — | — | — | — | — |
| Si | — | .5 | .6 | .3 | .5 | .5 | — |
| C | 3.2 | 1.05 | .3 | .2 | .15 | .5 | .12 |
| B | — | .003 | — | .6 | — | — | .01 |
| N | — | — | — | — | .15 | — | — |
| Zr | — | — | — | — | — | — | .1 |
| Al | 5 | — | — | — | — | — | 5.9 |
| Ti | — | — | — | .3 | — | — | .6 |
| $/lb (1981) | .48 | .77 | $1.10 | $1.80 | $6.50 | $14.3 | 3.36 |
| R. Stress, ksi 100 hrs 1500° F. | 38 | 23.5 | 17 | 8.6 | 16 | 20 | 44 |

TABLE 2

Final Weight Change after 200 hrs cyclic oxidation testing at 1600° F.

| Alloy # | Mn | Cr | Al | C | Wt. Loss g/cm² |
|---|---|---|---|---|---|
| 1 | 10 | 20 | — | 1 | .09 |
| 2 | 15 | 15 | — | 1 | .44 |
| 3 | 10 | 15 | 5 | 1 | <.01 |

TABLE 2-continued

Final Weight Change after 200 hrs cyclic oxidation testing at 1600° F.

| Alloy # | Mn | Cr | Al | C | Wt. Loss g/cm² |
|---|---|---|---|---|---|
| 10 | 10 | 15 | — | 1 | .46 |
| 12 | 15 | 15 | 2 | 1 | .45 |

TABLE 3

Final Weight Change after 96 hrs cyclic sulfidation testing at 1650° F. with 1 mg/cm² $Na_2SO_4$

| Alloy # | Cr | Mn | Al | C | Wt Loss g/cm² |
|---|---|---|---|---|---|
| 1 | 5 | 25 | — | 3.8 | Consumed |
| 2 | 10 | 20 | — | 3.3 | 377 |
| 3 | 15 | 15 | — | 3.2 | 243 |
| 4 | 20 | 10 | — | 3.2 | 68 |
| 5 | 15 | 15 | 5 | 2.7 | .6 |
| 6 | 25 | — | 4 | 2.8 | .1 |

We claim:

1. An iron base superalloy article, of multivariant eutectic composition, which comprises an austenitic (face centered cubic) matrix reinforced by aligned carbide fibers of the $M_7C_3$ type, where M consists of at least 80% of a material selected from the group consisting of Cr, Fe, Mn, Ni, Co and mixtures thereof: said fibers being present in an amount of about 30% by volume, and said austenitic matrix phase being stabilized by the presence of at least about 8% Mn.

2. An article as in claim 1 having an overall composition of 15–30% Cr, 8–20% Mn, 2–10% Al, 2.5–3.4% C, balance essentially iron.

3. An article as in claim 1 consisting essentially of 15–25% Cr, 10–20% Mn, 2–8% Al, 2.8–3.2% C.

4. An article as in claim 2 further containing up to 1% Mo, up to 1% of a material selected from the group consisting of Y, La, Sc and mixtures thereof and up to 20% of a material selected from the group consisting of Co, Ni and mixtures thereof.

5. An article as in claims 2 or 3 in which the Al content is less than about ½ of the Mn content.

6. An article as in claim 2 or 3 in which the sum of Mn and Cr contents is from about 25% to about 35% by weight.

7. An article as in claim 2 or 3 in which the sum of the Al and Cr contents exceeds about 20% by weight.

8. An article as in claim 4 in which the Al content is less than about ½ of the Mn content.

9. An article as in claim 4 in which the sum of Mn and Cr contents is from about 25% to about 35% by weight.

10. An article as in claim 4 in which the sum of the Al and Cr contents exceeds about 20% by weight.

* * * * *

UNITED STATES PATENT AND TRADEMARK OFFICE
CERTIFICATE OF CORRECTION

PATENT NO. : 4,441,939
DATED : April 10, 1984
INVENTOR(S) : Franklin D. Lemkey and Earl R. Thompson It is certified that error appears in the above-identified patent and that said Letters Patent is hereby corrected as shown below:

Col. 5, Table 1, line 43, "100" should read -- 1000 --.

Signed and Sealed this

Fourth Day of September 1984

[SEAL]

Attest:

GERALD J. MOSSINGHOFF

Attesting Officer        Commissioner of Patents and Trademarks